(12) United States Patent
Liu

(10) Patent No.: US 6,873,146 B2
(45) Date of Patent: Mar. 29, 2005

(54) INTEGRATED CIRCUIT TESTING DEVICE AND A METHOD OF USE THEREFOR

(75) Inventor: Jin Liu, Lewisville, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/387,344

(22) Filed: Mar. 12, 2003

(65) Prior Publication Data

US 2004/0178787 A1 Sep. 16, 2004

(51) Int. Cl.[7] .................................................. G01R 31/26
(52) U.S. Cl. ..................... 324/158.1; 324/763; 324/765
(58) Field of Search ......................... 324/158.1, 73.1, 324/763–765; 438/17–18; 714/724

(56) References Cited

U.S. PATENT DOCUMENTS

| | | | | |
|---|---|---|---|---|
| 3,983,479 A | * | 9/1976 | Lee et al. ................... | 324/537 |
| 4,725,773 A | * | 2/1988 | Lieneweg .................. | 324/73.1 |
| 5,051,690 A | * | 9/1991 | Maly et al. ................. | 324/537 |
| 6,061,814 A | * | 5/2000 | Sugasawara et al. ........ | 714/724 |
| 6,452,412 B1 | * | 9/2002 | Jarvis et al. ................ | 324/765 |

* cited by examiner

*Primary Examiner*—Minh N. Tang
(74) *Attorney, Agent, or Firm*—Yingsheng Tung; Wade James Brady, III; Frederick J. Telecky, Jr.

(57) ABSTRACT

The present invention provides an integrated circuit testing device 200 and a method of using the same. In one particular embodiment, the integrated circuit testing device may include a first circuit layer 220 located over a semiconductor substrate 210, wherein the first circuit layer 220 has a second circuit layer 230 located thereover. The integrated circuit testing device 200 of the same embodiment may further include a signal bond pad 240 selectively connectable to each of the first and second circuit layers 220, 230 to test at least one device on each of the first and second circuit layers 220, 230.

19 Claims, 3 Drawing Sheets

INTEGRATED CIRCUIT TESTING DEVICE AND A METHOD OF USE THEREFOR

TECHNICAL FIELD OF THE INVENTION

The present invention is directed, in general, to the testing of integrated circuits and, more specifically, to an integrated circuit testing device including at least first and second stacked circuit layers, and a method of use therefor.

BACKGROUND OF THE INVENTION

Fabrication of semiconductor integrated circuits (ICs) is an extremely complex process that involves hundreds of operations. Accordingly, it goes without saying that the hundreds of operations typically required to manufacture such semiconductor ICs create reliability issues. Therefore, in an attempt to increase the yield and reliability of semiconductor ICs, and thereby decrease the cost of the individual chips to the ultimate customer, the IC industry commonly performs tests to recognize and pinpoint various defects that may be affecting the yield of the semiconductor ICs.

Turning to Prior Art FIG. 1, illustrated is a conventional integrated circuit testing device 100 that might be used to perform yield tests. The conventional integrated circuit testing device 100 illustrated in FIG. 1 includes a circuit layer 120 formed on a silicon test chip 110. As is common in the industry, the circuit layer 120 is designed to test a single type of feature (i.e., a collection of similar features such as a collection of source/drain regions, a collection of wells, a collection of gate oxides, a collection of gate electrodes, a collection of interconnects, etc.) using three different test device areas. In the particular example of FIG. 1, the integrated circuit testing device 100 includes first, second and third test devices 130, 134, 138, having first, second and third areas, respectively, scaling in a desired fashion. As is known to those skilled in the art, the differing areas allow a defect density as well as a systematic yield loss to be calculated. By applying a test signal through the plurality of bond pads 140 located on the silicon test chip 110, yield measurements may be obtained.

Typically each conventional integrated circuit testing device 100 is limited to 20 bond pads. Generally, this is a result of pre-configured and conventional probe cards being used. Therefore, the bond pads for the conventional integrated circuit testing device 100 are typically fixed within a technology development and through a production cycle, and do not have much freedom of change due to cost and test standard implementation reasons. Accordingly, the limited number of bond pads substantially limits the number of features that can be tested using a single integrated circuit testing device 100. For example, because each of the test devices 130, 134, 138 require up to six independent pre-configured and hard wired bond pads (total of 18 bond pads) the integrated circuit testing device 100 is prevented from testing more than a single type of feature.

Unfortunately, each type of feature in a proposed IC layout process (e.g., typically consisting of about one hundred independent features for the entire process) must be tested, and therefore, each type of feature requires its own individual integrated circuit testing device 100. The prior art accommodates this requirement by forming multiple integrated circuit testing devices 100 adjacent one another on the silicon test chip 110. Typically, each of the multiple integrated circuit testing devices 100 must have a comparable equivalent area to the real product integrated circuit to get meaningful defect density data. Consequently, the multiple integrated circuit testing devices 100 use a substantial amount of silicon test chip 110 area. For example, for a typical analog CMOS process, about one hundred integrated circuit testing devices 100 are needed to conduct the minimum design rule test and one sub-design-rule test. These one hundred integrated circuit testing devices 100 typically occupy from about 40% to about 60% of the silicon test chip 110 area. As those skilled in the art are quite aware, the expense associated with this silicon test chip 110 area is proportional to the silicon occupied, and therefore costly.

Accordingly, what is needed in the art is an integrated circuit testing device that does not experience the drawbacks, especially the large amount of required silicon area, experienced by the prior art structures.

SUMMARY OF THE INVENTION

To address the above-discussed deficiencies of the prior art, the present invention provides an integrated circuit testing device and a method of using the integrated circuit testing device. In one particular embodiment, the integrated circuit testing device may include a first circuit layer located over or in a semiconductor substrate, wherein the first circuit layer has a second circuit layer located thereover, thus forming a stacked structure. The integrated circuit testing device of the same embodiment may further include a signal bond pad selectively connectable to each of the first and second circuit layers to test at least one feature on each of the first and second circuit layers.

The integrated circuit testing device, in a different embodiment, may include a circuit layer located over or in a semiconductor substrate, wherein the circuit layer includes at least a first test device and a second test device. In this particular embodiment, the signal bond pad may be selectively connectable to each of the first and second test devices to test at least one feature on each of the first and second test devices.

In addition to the integrated circuit testing devices disclosed herein, the present invention provides a method of using such integrated circuit testing devices. In one embodiment, the method includes providing an integrated circuit testing device having a first circuit layer located over a semiconductor substrate and a second circuit layer located over the first circuit layer, and selectively connecting a signal bond pad to each of the first and second circuit layers to test at least one feature on each of the first and second circuit layers.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

Prior Art

DETAILED DESCRIPTION

The present invention addresses the need for saving semiconductor wafer surface area in integrated circuit testing devices. In a broad sense, the present invention addresses this need by blending the technology currently used in conventional integrated circuit yield testing devices with the technology currently used in conventional addressable arrays, to achieve a novel integrated circuit testing device capable of employing a single set of bond pads to test multiple different testing devices in the integrated circuit testing device. Thus, where the conventional integrated circuit testing devices includes bond pads hard wired to a particular test device, the present invention uses an addressing scheme to allow at least a single bond pad to be selectively connectable to multiple different test devices. As the present invention allows a single bond pad to test multiple test devices, the number of bond pads, and therefore bond pad surface area, may be reduced. As such, a savings in semiconductor wafer surface area is realized.

Figure 1:
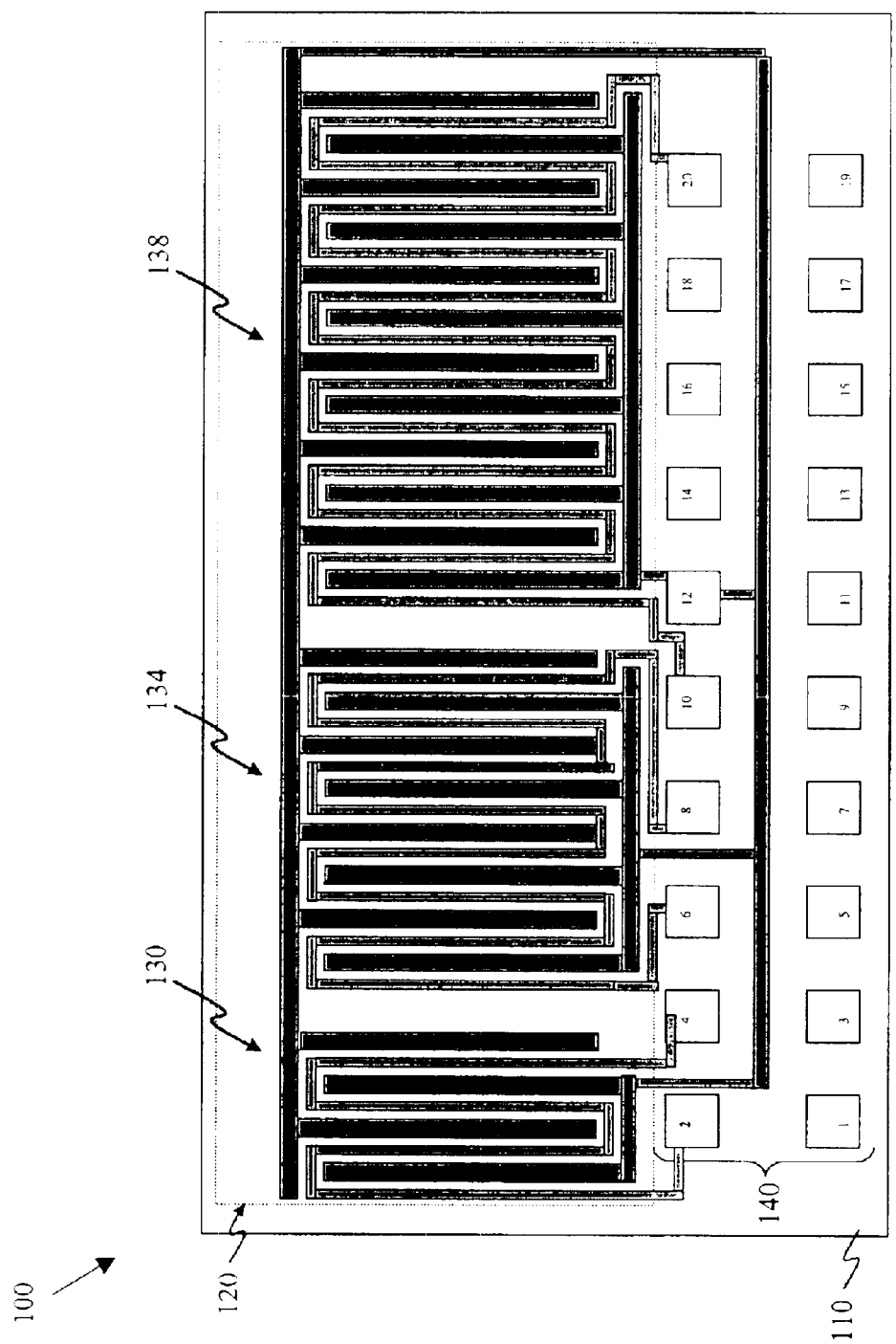
FIG. 1 illustrates a conventional integrated circuit testing device, which might be used to perform conventional yield tests.
Figure 2:
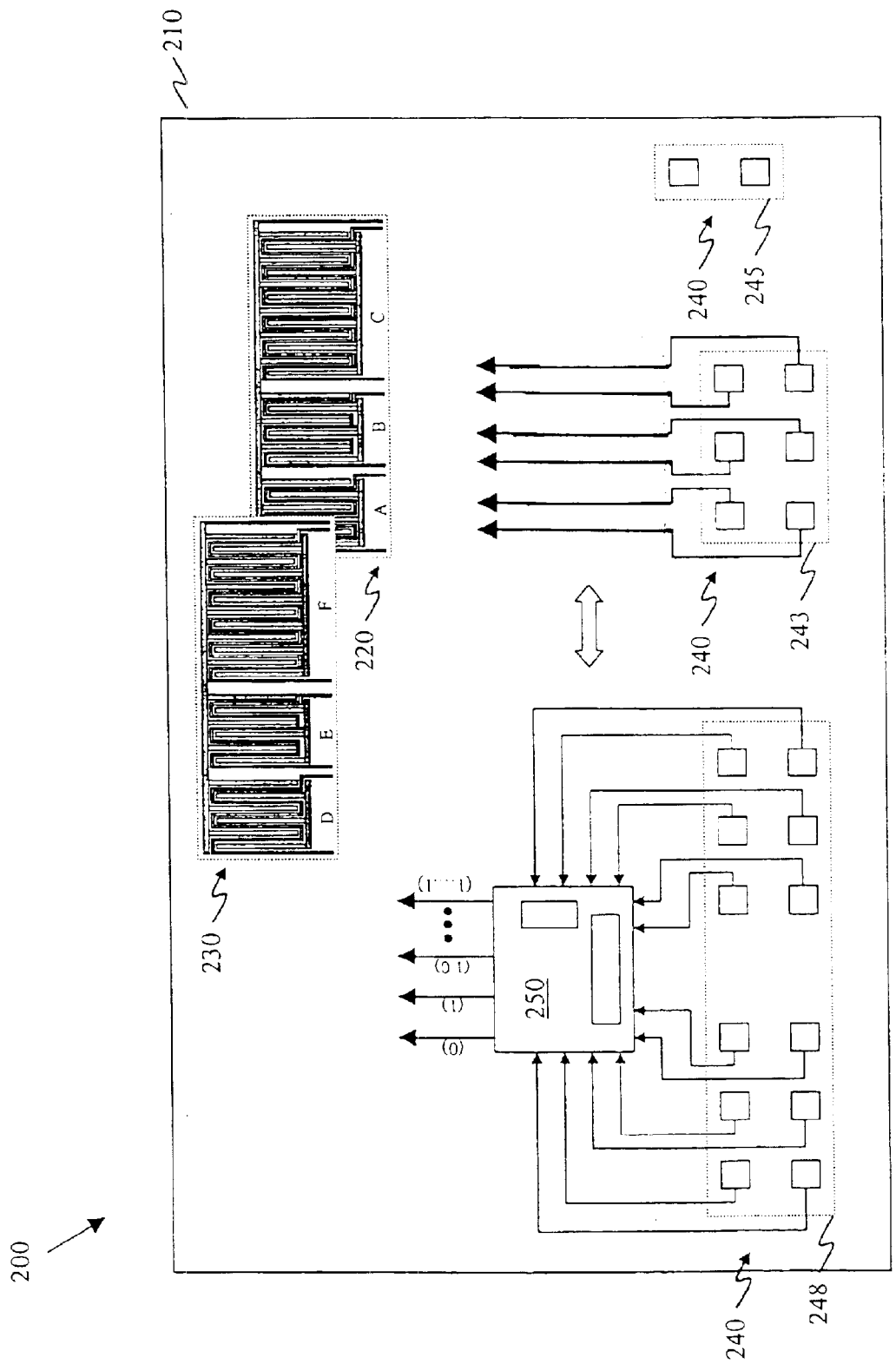
FIG. 2 illustrates a top view of one embodiment of an integrated circuit testing device configured to achieve savings in semiconductor wafer surface area, and constructed in accordance with the principles of the present invention.

Referring now to FIG. 2, illustrated is a top view of one embodiment of an integrated circuit testing device 200, known by some in the art as an Integrated Yield Monitor (IYM), configured to achieve the aforementioned savings in semiconductor wafer surface area, and constructed in accordance with the principles of the present invention. The integrated circuit testing device 200 illustrated in FIG. 2 includes a semiconductor substrate 210, such as a silicon test chip, having first and second circuit layers 220, 230, located thereover. As those skilled in the art are well aware, the semiconductor substrate 210 may be any layer located in an integrated circuit testing device 200, including a layer located at the wafer level, or a layer located thereover. In most instances, however, the semiconductor substrate 210 comprises a silicon wafer having a variety of other active and passive devices formed thereon.

As indicated above, the integrated circuit testing device 200 illustrated in FIG. 2 includes a first circuit layer 220 located over the semiconductor substrate 210. While the first circuit layer 220 of FIG. 2 is discussed as being located over the semiconductor substrate 210, other embodiments exist where the first circuit layer 220 is located directly on the semiconductor substrate 210. The first circuit layer 220, as shown, may include first, second and third test devices "A", "B", and "C". As known to those skilled in the art, the first, second and third test devices "A", "B", and "C" may include different test device areas containing the same types of devices in each. For example, in a level-I metal testing structure, the first test devices are constructed of metal serpentines and combs to test the short and open failure mode. It is common in the art for the first test device area to be bigger or equal to ¹⁄₂₁ of the approximate area of actual device that might be used in the proposed commercial device, and the second and third test devices ⁴⁄₂₁ and ¹⁶⁄₂₁, respectively, so that the total area of the test structure is comparable to the actual commercial device. As previously discussed, the comparable or bigger area of testing device ensures the accurate measurement of defect density. Additionally, the multiple test device areas enable differentiating systematic yield loss to random defect density. Different test device areas are, however, not required to stay within the broad scope of the present invention.

Further included within the integrated circuit testing device 200 illustrated in FIG. 2 is a second circuit layer 230 located over the first circuit layer 220. The second circuit layer 230 may be similar to the first circuit layer 220, however, the second circuit layer 230 may include fourth, fifth and sixth test devices "D", "E", and "F". Optimally, the fourth, fifth and sixth test devices "D", "E", and "F" are built on the same circuit layer, however, a different circuit layer than the first, second and third test devices "A", "B", and "C". If configured in such a way, the first circuit layer 220 may test one device layer (e.g., a metal-I structure) while the second circuit layer 230 may test a different feature layer (e.g., a metal-II structure). Generally, such stacking configuration can be performed on any process layers that are naturally non-interacting in process and electrical tests. By this we mean those layers isolated by insulation therebetween.

While the embodiment shown in FIG. 2 only includes first and second circuit layers 220, 230, those skilled in the art understand that any number of vertically stacked circuit layers may be used, and therefore are within the scope of the present invention. It can be envisioned, in one exemplary embodiment of the present invention, that an entire test configuration for a single technology development could be laid out as a few sets of vertically stacked circuit layers. For example, in one set, one circuit layer could be assigned to well structures, the next could be assigned to a gate poly structure, the next could be assigned to metal-I structures, etc. In another stacked circuit set, we can have source/drain, Metal-II, Metal-III, etc. This typically continues until all the devices desired to be tested were included within the vertically stacked circuit layers.

If the vertically stacked circuit layers were employed as just theorized, the total amount of semiconductor substrate surface area employed by the entire test configuration could be reduced by two to three fold, or more. It is estimated that for typical CMOS and analog processes on average 2–3 layers can be stacked in each test structure. For such processes it is further estimated that the resulting silicon usage can be reduced by two to three fold, or more. This reduction could easily save a large semiconductor manufacturing company millions of dollars per year in wafer usage. If those savings were passed on to the ultimate consumer, the large semiconductor manufacturing company could realize a substantial competitive edge over those companies not using such a process.

Referring again to FIG. 2, the integrated circuit testing device 200 further includes a plurality of bond pads 240 located on the semiconductor substrate 210. In the particular embodiment shown in FIG. 2, the plurality of bond pads 240 is limited to 20 total bond pads. It should be noted, however, that while 20 total bond pads per integrated circuit testing device 200 is normal the present invention should not be limited to such. Accordingly, an integrated circuit testing device 200 having more or less than 20 bond pads is well within the scope of the present invention. Nonetheless, to reduce confusion the present invention will be discussed using a situation where the integrated circuit testing device 200 is limited to 20 total bond pads.

The plurality of bonds pads 240, which may perform different functions, may generally be divided into three main categories: signal bond pads 243, miscellaneous bond pads 245, and decoder bit bond pads 248. Those bond pads labeled signal bond pads 243 are typically designed to provide a test signal to a device in a test device, and generally require from about 2 to about 6 bond pads. Those bond pads labeled miscellaneous bond pads 245 are typically designed to provide power and grounding to the integrated circuit testing device 200 decoder, among other things, and generally require about 2 bond pads. The remaining bond pads, labeled decoder bit bond pads 248, are typically designed to control an addressing system 250 (discussed in more detail below). Obviously, the specific number of the plurality of bond pads 240 relegated to signal bond pads 243, miscellaneous bond pads 245, and decoder bit bond pads 248, respectively, may vary.

In the particular embodiment shown in FIG. 2, the decoder bit bond pads 248 are connected to the addressing system 250. The addressing system 250, which may include addressing circuitry, employs signals provided from the decoder bit bond pads 248 to selectively connect at least one of the signal bond pads 243 to each of the test devices of the first and second circuit layers 220, 230, and more particularly, to each device included within each of the first and second circuit layers 220, 230. In the illustrative embodiment the addressing system 250 is located on the semiconductor substrate 210. This is not always the case. For example, in certain embodiments it can be envisioned where portions of the addressing system 250 are located on the various circuit layers located within the integrated circuit testing device 200, or elsewhere.

The addressing system 250, in one particular embodiment, employs a single decoder to selectively connect one or several of the testing devices to enable one particular electrical measurement. The single decoder, in one embodiment, includes at least two sets of binary addresses. For example, one of those binary addresses, in this embodiment, might be associated with a testing device on the first circuit layer 220, while the other of those binary addresses might be associated with another testing device on the second circuit layer 230. Alternatively, one of the binary addresses might be associated with a testing device on the first circuit layer 220, while the other of those binary addresses might be associated with a different testing device on the first circuit layer 220. The number of testing devices that the signal bond pads could connect to would only be limited by the number of binary addresses the decoder could generate.

The addressing system 250, in an alternative embodiment, might employ multiple decoders to selectively connect the signal bond pads to each of the testing devices. For example, a first device decoder could be used to generate a first binary address associated with a specific type of device. Likewise, a second layer decoder could be used to generate a second binary address associated with a specific layer. Using a collection of different first and second binary addresses, the addressing system 250 should be able to selectively connect the signal bond pads to any testing device on any layer. While the addressing system 250 has been discussed with respect to situations where it employs either a single decoder or a device decoder and a layer decoder, it should be noted that any other known or hereafter discovered configuration that allows at least one of the signal bond pads to be connected to each testing device, would suffice.

Figure 3:
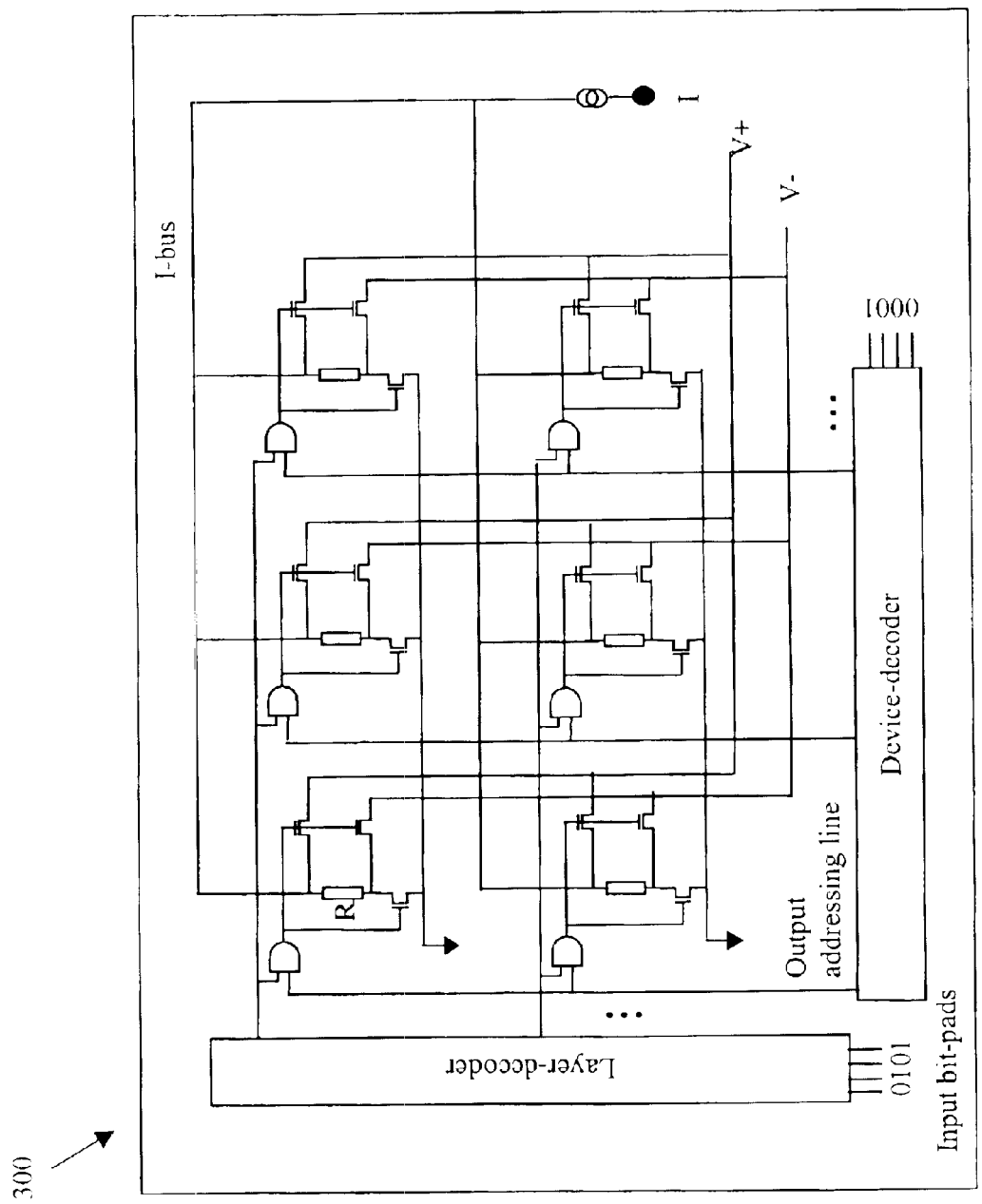
FIG. 3 illustrates one embodiment of addressing circuitry that might be used by an addressing system to selectively connect at least one of the signal bond pads to each of the various layers and features in the integrated circuit testing device.

Turning briefly to FIG. 3, illustrated is one embodiment of addressing circuitry 300 that might be used by the addressing system 250 to selectively connect three of the signal bond pads 243 to various layers and devices in the integrated circuit testing device 200 illustrated in FIG. 2. Here the resistor type test structure is used as an example. Embedded with each test structure is one AND-gate. Only when the addressing lines from layer-decoder and structure decoder are both set to 1, the output of the AND-gate is 1. Only when the output of the AND-gate is equal to 1, the 3 transmission gate transistors embedded with the test structure are turned on so that the signal pads (I, V+ and V−) are connected. The decoder is a device that sets only one output addressing line to 1 according to the address bits set by input bit-pads. All other addressing output lines are set to 0. With this scenario, all test structures can be tested one at a time with common signal pads only by setting the input bit-pads of the decoders to high or low voltages (1 or 0 binary coding), while other non-selected test structures remain passive except minor parasitic effects (draining moderate leakage current from common I-bus). The presented addressing scheme totally separates the logic circuitry (decoder and AND-gate) from the analogy circuitry (transmission gates and bus-lines connected to the signal pads). This simplifies the tests and interpretation of tests significant. It should be noted that the addressing scheme is very general. Resistor, transistor, capacitors and inductor type of components can all be tested under similar configuration, despite the fact that the coupling spec (transmission gate conductance, capacitance, leakage and etc.) may need to be tailored to specific need of the test and the precision of the test. While a specific example has been set out, any known or hereafter discovered addressing circuitry is within the scope of the present invention.

Therefore, using simple addressing circuitry unique to the present invention, signal bond pads 243 may be selectively connectable to each of the first and second circuit layers 220, 230, to test at least one device on each of the first and second circuit layers 220, 230. In laymen terms, any device on any one circuit layer may be selectively connected to at least one of the available signal bond pads. For example, if an integrated circuit testing device was limited to (W) total number of bond pads, wherein (X) number were miscellaneous bond pads (e.g., power), (Y) number were signal bond pads, and (Z) number were decoder bit bond pads, up to about $2^{(W-X-Y)}$ (alternatively $2^Z$) devices could be selectively connectable to at least one of the (Y) number of signal bond pads. Consequently, using a typical situation where 20 total bond pads exist (W=20), 2 miscellaneous bond pads are required (X=2), 4 to 6 signal bond pads are required (Y=4 to 6), the resulting number of decoder bit bond pads is equal to about 12 to about 14 (Z=12 to 14). In this particular situation, up to about $2^{12}$ (i.e., 4,096) to about $2^{14}$ (i.e., 16,384) electrical paths, and therefore devices, could be selectively connected to at least one of the 4 to 6 bond pads. Thus, where the prior art devices were limited in flexibility (i.e., each signal bond pad was hard wired to a specific device for a specific test device) the present invention is almost unlimited in its possibilities.

Further, given the number of possibilities that may exist for connecting different devices to different signal bond pads, those skilled in the art should recognize that it is quite possible to have many circuit layers stacked over one another, each testing many different devices. Thus, where the prior art devices were required to build their circuit layers proximate one another on the semiconductor substrate (using from 40% to 60% of its surface area), the present invention is capable of stacking such layers (thereby using only from about 13% to about 20%, or less, of its surface area.) As such, substantial economic benefits may be realized by the manufacturer, as well as the end customer.

The addressing scheme stated above can also help organize the test data. The codes associated with layers and devices are set in ordered sequence during the test. The devices in each circuit layers, and the each circuit are tested in the sequence accordingly. Consequently, the addressing code and test data forms a natural data structure to organize the data and store them in database.

Although the present invention has been described in detail, those skilled in the art should understand that they can make various changes, substitutions and alterations herein without departing from the spirit and scope of the invention in its broadest form.

What is claimed is:

1. An integrated circuit testing device, comprising:
   a semiconductor substrate;
   a first circuit layer located over or in said semiconductor substrate;
   a second circuit layer located over said first circuit layer; and
   a signal bond pad selectively connectable to each of said first and second circuit layers to test at least one device on each of said first and second circuit layers;
   Y signal bond pads and Z decoder-bit bond pads, said Y signal bond pads selectively connected to about $2^z$ plurality of devices.

2. The integrated circuit testing device as recited in claim 1 further including an addressing system having at least two sets of binary addresses wherein a first set of said binary addresses is associated with a device type on said first circuit layer and a second set of said binary addresses is associated with a device type on said second circuit layer.

3. The integrated circuit testing device as recited in claim 2 wherein said addressing system includes a decoder.

4. The integrated circuit testing device as recited in claim 1 further including an addressing system having at least two sets of binary addresses wherein a first set of said binary addresses is associated with a device type on said first and second circuit layers and a second set of said binary addresses is associated with said first and second circuit layers.

5. The integrated circuit testing device as recited in claim 4 wherein said addressing system includes a device decoder and a layer decoder.

6. The integrated circuit testing device as recited in claim 1 wherein said first and second circuit layers form a portion of a plurality of vertically stacked circuit layers and further including a plurality of signal bond pads wherein each of said plurality of signal bond pads is selectively connectable to each one of said plurality of vertically stacked circuit layers.

7. The integrated circuit testing device as recited in claim 1 wherein said integrated circuit testing device includes a total of 20 bond pads, said 20 bond pads including from about 12 to about 14 decoder bit bond pads and about 4 to about 6 signal bond pads.

8. The integrated circuit testing device as recited in claim 7, wherein said about 12 to about 14 decoder bit bond pads help selectively connect said about 4 to about 6 signal bond pads to up to about 212 to 214 plurality of devices.

9. An integrated circuit testing device, comprising:
   a circuit layer located over or in a semiconductor substrate, wherein said circuit layer includes at least a first test device and a second test device;
   a signal bond pad selectively connectable to each of said first and second test devices to test at least one device on each of said first and second test devices;
   Y signal bond pads and Z decoder-bit bond pads, said Y signal bond pads selectively connectable to about $2^z$ plurality of devices.

10. The integrated circuit as recited in claim 9 further including an addressing system configured to selectively connect said signal bond pad to each of said first and second test devices.

11. The integrated circuit as recited in claim 10 wherein said addressing system includes a decoder for selectively connecting said signal bond pad to each of said first and second test devices.

12. The integrated circuit as recited in claim 9 wherein said circuit layer is a first circuit layer, and further including a second circuit layer located over said first circuit layer and having third and fourth test devices, wherein said signal bond pad is selectively connectable to each of said first, second, third and fourth test devices to test at least one device on each of said first, second, third and fourth test devices.

13. The integrated circuit testing device as recited in claim 12 wherein said first and second circuit layers form a portion of a plurality of vertically stacked circuit layers and further including a plurality of signal bond pads wherein each of said plurality of signal bond pads is selectively connectable to each one of said plurality of vertically stacked circuit layers.

14. The integrated circuit testing device as recited in claim 9 wherein said integrated circuit testing device includes a total of 20 bond pads, said 20 bond pads including from about 12 to about 14 decoder bit bond pads and about 4 to about 6 signal bond pads wherein said about 12 to about 14 decoder bit bond pads help selectively connect said about 4 to about 6 signal bond pads to up to about 212 to 214 plurality of devices.

15. A method of using an integrated circuit testing device, comprising:
   providing an integrated circuit testing device having a first circuit layer located over or in a semiconductor substrate and a second circuit layer located over said first circuit layer;
   providing Y signal bond pads and Z decoder-bit bond pads, said Y signal bond pads selectively connectable to about $2^2$ plurality of devices, including devices in the first circuit layer and in the second circuit layer.

16. The method as recited in claim 15, wherein selectively connecting includes using an addressing system to address the devices.

17. The method as recited in claim 16 wherein said addressing system provides at least two sets of binary addresses wherein a first set of said binary addresses is associated with a device type on said first circuit layer and a second set of said binary addresses is associated with a device type on said second circuit layer, and using said at least two sets of binary address to selectively connect said signal bond pad.

18. The method as recited in claim 16 wherein said addressing system provides at least two sets of binary addresses wherein a first set of said binary addresses is associated with a device type on said first and second circuit layers and a second set of said binary addresses is associated with said first and second circuit layers, and using said at least two sets of binary address to selectively connect said signal bond pad.

19. The method as recited in claim 16 wherein said first and second circuit layers form a portion of a plurality of vertically stacked circuit layers and further including a plurality of signal bond pads, and using said addressing system to selectively connect any one of said plurality of signal bond pads to any device on any one of said plurality of vertically stacked circuit layers.

* * * * *